United States Patent [19]

Davaut

[11] Patent Number: 4,870,354
[45] Date of Patent: Sep. 26, 1989

[54] APPARATUS FOR CONTACTING A PRINTED CIRCUIT BOARD WITH AN ARRAY OF TEST PROBES

[75] Inventor: Jean F. Davaut, Issy les Moulineaux, France

[73] Assignee: Zehntel, Inc., Walnut Creek, Calif.

[21] Appl. No.: 231,146

[22] Filed: Aug. 11, 1988

[51] Int. Cl.$^4$ ..................... G01R 31/02; G01R 15/12
[52] U.S. Cl. ............................. 324/158 F; 324/158 P; 324/73 PC
[58] Field of Search ........... 324/158 F, 158 P, 73 PC, 324/73 AT, 72.5

[56] References Cited

U.S. PATENT DOCUMENTS

| | | |
|---|---|---|
| 3,016,489 | 1/1962 | Briggs et al. . |
| 3,805,159 | 4/1974 | Richelmann ................ 324/158 F X |
| 3,906,363 | 9/1975 | Fowler ........................ 324/158 F X |
| 4,017,793 | 4/1977 | Haines ............................... 324/158 F |
| 4,108,528 | 8/1978 | Long et al. .................. 324/158 P X |
| 4,138,186 | 2/1979 | Long et al. .................. 324/158 P X |
| 4,216,539 | 8/1980 | Raymond et al. ................ 324/73 R |
| 4,339,819 | 7/1982 | Jacobson ........................... 324/73 R |
| 4,593,804 | 6/1986 | Kinsey et al. ..................... 193/41 X |
| 4,746,861 | 5/1988 | Nesbitt ............................ 324/158 P |

FOREIGN PATENT DOCUMENTS 55-147363 11/1980 Japan .

Primary Examiner—Reinhard J. Eisenzopf
Assistant Examiner—Vinh Nguyen
Attorney, Agent, or Firm—Arnold, White & Durkee

[57] ABSTRACT

A printed circuit board test fixture has both a vacuum chamber and a bed of nails. Holes through the body of the test fixture coincide with test points on the circuit board to be tested. The ends of spring-loaded probes in some of the holes protrude from the surface of the test fixture to form the bed of nails. Each end lines up with an associated test node on the printed circuit board. An external vacuum source evacuates air from the vacuum chamber within the test fixture, thus evacuating air from beneath the printed circuit board. The printed circuit board is thus pulled against the bed of nails, the test probe ends contacting the test nodes on the printed circuit board.

11 Claims, 1 Drawing Sheet

APPARATUS FOR CONTACTING A PRINTED CIRCUIT BOARD WITH AN ARRAY OF TEST PROBES

BACKGROUND AND SUMMARY OF THE INVENTION

This invention relates to a means for guiding a printed circuit board, which is to be tested, into precise location on a test fixture. More particularly, the invention includes a vacuum distribution medium for aligning and contacting an array of spring-loaded test probes (also called "pogo probes", and the array is sometimes called a "bed of nails") with a printed circuit board to be tested.

The electronics industry uses bed of nails test fixtures for the electrical testing of printed circuit boards, both bare and loaded circuit boards. Such test fixtures contact a circuit board with an array of test probes, so that the test probes electrically contact predetermined test points on the board. The operator then tests the entire circuit, or individual circuit components, using methods known in the art.

In commercially available test fixtures in present use, tooling guide pins fixed onto the test fixture position the printed circuit board to be tested over the test probe array. A printed circuit board usually has two or more tooling holes. The tooling guide pins locate in the board's tooling holes, and thus locate the board.

In order for the test results to be accurate, the test probes must accurately contact their corresponding test points on the board. As circuit and component density increases, the required degree of accuracy also increases.

A printed circuit board test system may have a large number of programmable signal drivers to input various stimulation signals to the printed circuit board to be tested, and a large number of programmable signal receivers for receiving the various signals generated by the printed circuit board as a result of the input stimuli. Typically, such a printed circuit board test system has an array of test probes arranged in a rectangular array or grid having 100 mil. centers. A particular printed circuit board to be tested will usually have a large number of test points which are randomly distributed over the surface of the printed circuit board.

Although existing test fixtures may use a vacuum actuated system for contacting a printed circuit board with an array of test probes, most of those systems are complex in structure, having a number of complicated moving parts.

The present invention addresses the above-noted and other drawbacks of the prior art by providing a test fixture to contact a printed circuit board with an array of test probes.

The invention provides a vacuum-operated pull-down device of uncomplicated construction having no moving parts apart from the spring-loaded test probes. The spring-loaded test probes line up substantially with each test point on the printed circuit board. The invention eliminates the undesirable feature of complex moving parts common to existing devices.

The test fixture includes a platen assembly. The platen assembly includes two substantially identical plates which when connected together form a vacuum chamber. One of the plates has a hole which serves as a vacuum port. The platen assembly has passageways extending through both plates. The passageways are located according to the template used to drill the plated-through holes in the printed circuit board under test. Tooling guide pins in vacuum-tight relation in two of these passageways locate with tooling holes on the printed circuit board. Test probes extend in vacuum-tight relation through other passageways. When an operator places a printed circuit board to be tested on the tooling guide pins, the plated-through holes located at the test points of the printed circuit board line up substantially with the test probes.

A peripheral seal on the surface of the platen forms an air-tight seal between the surface of the platen and the printed circuit board.

Generally, only about one-third of the passageways in the platen are required for test probes. The remaining passageways are left vacant. To enable the chamber to hold a vacuum, the operator seals with a sealing tape the vacant holes opening out to the surface of the platen opposite the printed circuit board. The operator then applies a vacuum to the chamber, and the remaining holes on the side of the platen facing the printed circuit board cause a vacuum in the cavity beneath the printed circuit board, lowering the board and causing the test points to contact their respective test probes.

BRIEF DESCRIPTION OF THE DRAWINGS

The above-noted and other aspects of the present invention will become more apparent from a description of the preferred embodiment when read in conjunction with the accompanying drawings.

The drawings illustrate a preferred embodiment of the invention, wherein like members bear like reference numerals and wherein.

DESCRIPTION OF THE PREFERRED EMBODIMENT

Figure 1:
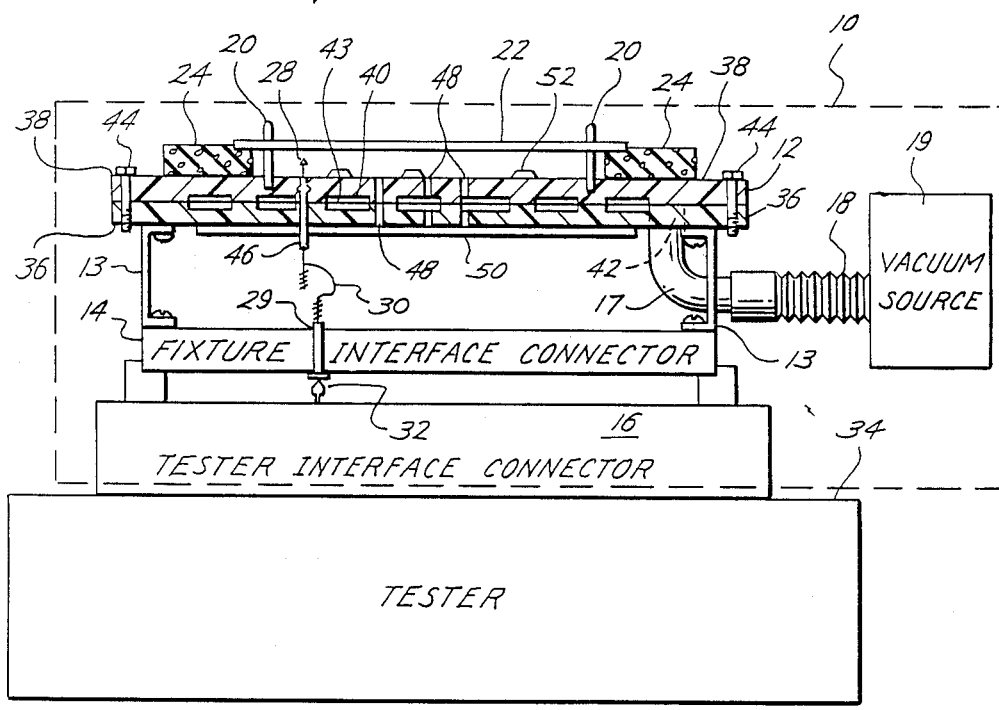
FIG. 1 is a partially sectional view of a printed circuit board test fixture.

Referring to FIG. 1, a test system built according to the present invention is illustrated. Prior art test systems are described in the following U.S. patents which are incorporated herein by reference: U.S. Pat. No. 4,216,539, issued Aug. 5, 1980 to Raymond et al., and U.S. Pat. No. 4,339,819, issued July 13, 1982 to Jacobson. The test system includes a test fixture 10. The test fixture 10 includes a platen assembly 12 connected to a fixture interface connector 14 which is connected to a tester interface connector 16. Support brackets 13 attach the platen assembly 12 to the fixture interface connector 14. The test fixture 10 also includes a vacuum adapter 17 connected to the platen assembly 12, a vacuum hose 18 connected to the vacuum adapter 17, and a vacuum source 19 connected to the vacuum hose 18.

Tooling pins 20 locate a printed circuit board 22 on the test fixture 10. A flexible peripheral seal 24 supports the printed circuit board 22 and seals it to the platen assembly 12. The vacuum source 19 creates a vacuum which pulls the printed circuit board 22, thereby compressing the seal 24, and causing the board 22 to contact spring-loaded test probes 28 which protrude from the platen assembly 12.

The peripheral seal 24 is preferably made of closed cell foam or other compliant seal material, and is custom tailored to the printed circuit board. The peripheral seal 24 seals against vacuum leakage around the periphery of the printed circuit board. The peripheral seal 24 also functions as a return spring which lifts the printed circuit board away from contact with the test probes 28 when the vacuum is released.

Signal wires 30 electrically connect the test probes 28 to fixture contacts 29 in the fixture interface connector 14. Tester contacts 32 electrically connect the fixture contacts 29 to the tester interface connector 16. A tester 34 tests the printed circuit board via the test fixture 10.

The platen assembly has two substantially identical plates or elements, a lower element 36 and an upper element 38. Each element is about one quarter-inch thick, and is made of G10, a plastic compound material with good electrical insulation properties. Any similar material could be used.

Figure 2:
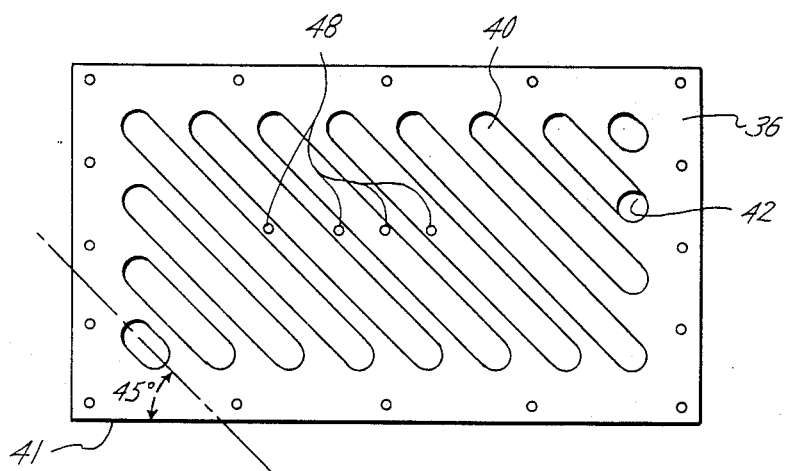
FIG. 2 is a plan view of the inside face of the lower one-half of the platen depicted in FIG. 1 showing the grooves which form a chamber when the two platen halves are joined together.

FIG. 2 illustrates the lower element 36, which has a number of shallow grooves 40 at forty-five degrees to the major axis 41. The grooves 40 do not extend to the edge of the elements 36 and 38, and are approximately 0.040" deep. The exact depth is not critical as long as the grooves 40 are not so deep that they structurally weaken the material or decrease its ability to retain probe receptacles. The grooves 40 also must not be so shallow that they unduly restrict the exit of air when vacuum is applied. The ridges between the grooves act as strengthening ribs for the platen assembly. A vacuum inlet hole 42 in the lower element 36 is located to be in fluid communication with the grooves 40. The vacuum adapter 17 connects to the vacuum inlet hole 42.

The lower element 36 mates with the upper element 38 so that the grooves 40 in the lower element 36 preferably cross the grooves 40 in the upper element 38 at ninety degrees. In this way the grooves 40 form a closed labyrinth or grid-like chamber 43 connected to the vacuum inlet hole 42. Screws 44 hold the two elements 36 and 38 tightly together; other suitable fastening means may be used.

Passageways 48 pass through the elements 36 and 38 of the platen assembly 12. The passageways 48 are "pad master drilled" using the same grid template used in drilling the printed circuit board. A number of the passageways 48 thus correspond with test points (not shown) on the printed circuit board 22. A probe socket 46 occupies each passageway 48 which corresponds with a test point on the printed circuit board. Each probe socket 46 contains a test probe 28. Due to the number of test points typically probed on a printed circuit board 22, approximately two thirds of the passageways 48 typically will remain vacant. The vacant passageways 48 allow air to be evacuated from under the printed circuit board when the test fixture 10 is in use. Thus the elements 36 and 38, taken together, cooperate to form a guiding means to guide the test probes 28 into contact with the test points on the solder side of the circuit board 22.

A lower element seal 50 seals the lower surface of the lower element 36, preventing vacuum from leaking through the vacant holes 48 in the lower element. The seal 50 is a sheet of adhesive-backed plastic. Although the probe sockets 46 fit tightly enough in the holes 48 to prevent vacuum leakage along the path of the socket, the lower element seal 50 also serves to prevent vacuum leakage through the holes 48 containing the probe sockets 46.

Appropriate holes in the upper element 38 retain the tooling pins 20. The tooling pins 20 engage matching tooling holes (not shown) in the printed circuit board. The tooling pins ensure that the printed circuit board registers precisely with the test-probes 28 at the time of testing.

Leveling stops 52 attached to the upper surface of the platen assembly 12 -keep the printed circuit board 22 flat when vacuum is applied and prevent excessive compression ("bottoming") of the test probe springs.

In operation, an operator places a printed circuit board 22 so as to register with the tooling pins 20 and rest on the seal 24. The operator then activates the vacuum source 19, which evacuates air from the chamber 43, which in turn evacuates the space underneath the printed circuit board. Atmospheric pressure then presses the printed circuit board 22 towards the platen assembly 12, compressing the test probes 28 and the peripheral seal 24, until the board 22 contacts the leveling stops 52. The tooling pins 20 guide and register the printed circuit board 22 into its correct location above the platen assembly 12.

Following completion of the test, atmospheric pressure is introduced through the vacuum hose into the chamber 43. The resilient peripheral seal 24 moves the printed circuit board away from the test probes 28 until the printed circuit board reaches the rest position illustrated in FIG. 1. The operator then removes the printed circuit board.

The principles, preferred embodiments and modes of operation of the present invention have been described in the foregoing specification. The invention is not to be construed as limited to the particular forms disclosed, since these are regarded as illustrative rather than restrictive. Moreover, variations and changes may be made by those skilled in the art without departing from the spirit of the invention.

What is claimed is:

1. A platen assembly for contacting with an array of test probes a printed circuit board having a plurality of test points, the platen assembly comprising:

a. two plates adapted to fit together in a vacuum-tight relation, each plate having an inner planar surface and an outer planar surface, the inner planar surfaces adapted to abut one another when fitted together;

b. a plurality of grooves in each inner planar surface to define a chamber within the platen assembly;

c. the outer planar surface of a first plate of the plates adapted to receive a printed circuit board in a test position spaced outwardly from a selected portion of the outer planar surface;

d. a port in one of the plates for connecting said chamber to a source of vacuum;

e. a plurality of passageways extending through the plates when assembled, a first end of each passageway terminating in the selected portion of the first plate, each passageway configured to receive a test probe in a vacuum-tight relation so that an end of the probe contacts its respective test point when the printed circuit board is in the test position; and f. at least one aperture in the first plate configured to provide fluid communication between the chamber and the printed circuit board when the board is in the test position.

2. The platen assembly of claim 1 further including a seal extending around the periphery of the selected portion on the outer planar surface of the first plate, the seal adapted to engage and provide a vacuum tight seal with the periphery of the solder side of a printed circuit board when the printed circuit board is in the test position.

3. a test system for testing a printed circuit board having a plurality of test points distributed over a solder side of the board, the test system comprising:
a. a tester;
b. a platen assembly attached to and conductively coupled to the tester, the platen assembly comprising:
   i. two plates adapted to fit together in vacuum-tight relation, each plate having an inner planar surface and an outer planar surface, the inner planar surfaces adapted to aut one another when fitted together;
   ii. a plurality of grooves in each inner planar surface to define a chamber within the platen assembly;
   iii. the outer planar surface of a first plate of the plates adapted to receive a printed circuit board in a test position spaced outwardly from a selected portion of the outer planar surface;
   iv. a port in one of the plates for connecting said chamber to a source of vacuum;
   v. a plurality of passageways extending through the plates when assembled, a first end of each passageway terminating in the selected portion of the first plate, each passageway configured to receive a test probe in a vacuum-tight relation so that an end of the probe contacts its respective test point when the printed circuit board is in the test position; and
   vi. at least one aperture in the first plate configured to provide fluid communication between the chamber and the printed circuit board when the board is in the test position.

4. The test system of claim 3 further including a seal extending around the periphery of the selected portion on the outer planar surface of the first plate, the seal adapted to engage and provide a vacuum tight seal with the periphery of the solder side of a printed circuit board when the printed circuit board is in the test position.

5. A test system for testing a printed circuit board having a plurality of test points distributed over a solder side of the board, the test system comprising:
a. tester;
b. a platen assembly attached to and conductively coupled to the tester, the platen assembly comprising:
   i. two matching plates adapted to fit together in a vacuum-tight relation, each plate having an inner planar surface and an outer planar surface, the inner planar surfaces adapted to abut one another when fitted together;
   ii. a plurality of grooves in each inner planar surface configured to cross over the grooves in the other inner surface in transversely disposed relation to define a labyrinth of grooves within the platen assembly;
   iii. the outer planar surface of a first plate of the plates adapted to receive a printed circuit board in a test position spaced outwardly from a selected portion of the outer planar surface;
   iv. a port in one of the plates connected at a first end to the labyrinth and adapted to be connected at its second end to a source of vacuum;
   v. a plurality of passageways extending through the plates when assembled, the passageways transversely disposed to the plates, a first end of each passageway terminating in the selected portion of the first plate opposite a separate one of the test points, each passageway configured to receive a test probe in a vacuum-tight relation so that a test point contact end of the probe contacts its respective test point when the board is in the test position; and
   vi. at least one aperture in the first plate configured to provide fluid communication between the labyrinth and the solder side of a printed circuit board when the board is in the test position.

6. The test system of claim 5 further including a seal extending around the periphery of the selected portion on the outer planar surface of the first plate, the seal adapted to engage and provide a vacuum tight seal with the periphery of the solder side of a printed circuit board when the printed circuit board is in the test position.

7. A test system for testing a printed circuit board having a plurality of test points distributed over a solder side of the board, the test system comprising:
a. a tester;
b. a tester interface connector conductively coupled to the tester;
c. a fixture interface connector conductively coupled to the tester interface connector;
d. a platen assembly attached to and conductively coupled to the fixture interface connector, the platen assembly comprising:
   i. two matching plates adapted to fit together in a vacuum-tight relation, each plate having an inner planar surface and an outer planar surface, the inner planar surfaces adapted to abut one another when fitted together;
   ii. a plurality of grooves in each inner planar surface configured to cross over the grooves in the other inner surface in transversely disposed relation to define a labyrinth of grooves within the platen assembly;
   iii. the outer planar surface of a first plate of the plates adapted to receive a printed circuit board in a test position spaced outwardly from a selected portion of the outer planar surface;
   iv. a port in one of the plates connected at a first end to the labyrinth and adapted to be connected at its second end to a source of vacuum;
   v. a plurality of passageways extending through the plates when assembled, the passageways transversely disposed to the plates, a first end of each passageway terminating in the selected portion of the first plate opposite a separate one of the test points, each passageway configured to receive a test probe in a vacuum-tight relation so that a test point contact end of the probe contacts its respective test point when the board is in the test position; and
   vi. at least one aperture in the first plate configured to provide fluid communication between the labyrinth and the solder side of a printed circuit board when the board is in the test position.

8. The test system of claim 7 further including a seal extending around the periphery of the selected portion on the outer planar surface of the first plate, the seal adapted to engage and provide a vacuum tight seal with the periphery of the solder side of a printed circuit board when the printed circuit board is in the test position.

9. A platen assembly for contacting with an array of test probes a printed circuit board having a plurality of test points distributed over a solder side of the board, the platen assembly comprising:

a. two matching plates adapted to fit together in a vacuum-tight relation, each plate having an inner planar surface and an outer planar surface, the inner planar surfaces adapted to abut one another when fitted together;
b. a plurality of grooves in each inner planar surface configured to cross over the grooves in the other inner surface in transversely disposed relation to define a labyrinth of grooves within the platen assembly;
c. the outer planar surface of a first plate of the plates adapted to receive a printed circuit board in a test position spaced outwardly from a selected portion of the outer planar surface;
d. a port in one of the plates connected at a first end to the labyrinth and adapted to be connected at its second end to a source of vacuum;
e. a plurality of passageways extending through the plates when assembled, the passageways transversely disposed to the plates;
f. a first end of each passageway terminating in the selected portion of the first plate opposite a separate one of the test points;
g. each passageway configured to receive a test probe in a vacuum-tight relation so that a test point contact end of the probe contacts its respective test point when the board is in the test position; and
h. at least one aperture in the first plate configured to provide fluid communication between the labyrinth and the solder side of a printed circuit board when the board is in the test position.

10. The platen assembly of claim 9 further including a seal extending around the periphery of the selected portion on the outer planar surface of the first plate, the seal adapted to engage and provide a vacuum tight seal with the periphery of the solder side of a printed circuit board when the printed circuit board is in the test position.

11. In a tester for testing a circuit board, the tester having test probes, apparatus for contacting the circuit board with the test probes, the apparatus comprising:
a. guiding means for guiding the test probes into contact with the circuit board, the guiding means having first and second mating members and including:
 i. first apertures through the first and second mating members of the guiding means for enabling the test probes to pass through the guiding means into contact with the circuit board opposite the first mating member of the guiding means;
 ii. second apertures in the first mating member of the guiding means adapted to apply a vacuum against the circuit board capable of drawing the circuit board against the first mating member.
 iii. sealing means for sealing the first apertures on the second mating member of the guiding means;
 iv. a chamber within the guiding means, defined between said first and second mating members, in communication with the second apertures;
 v. an inlet hole for connecting the chamber to a vacuum source; and
b. a peripheral seal attached to the periphery of the first mating member of the guiding means for vacuum sealing between the circuit board and the guiding means.

* * * * *